(12) United States Patent
Ji

(10) Patent No.: US 11,323,116 B2
(45) Date of Patent: May 3, 2022

(54) MULTI-LEVEL DRIVE DATA TRANSMISSION CIRCUIT AND METHOD

(71) Applicant: ChangXin Memory Technologies, Inc., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/055,082

(22) PCT Filed: Nov. 22, 2019

(86) PCT No.: PCT/CN2019/120279
§ 371 (c)(1),
(2) Date: Nov. 12, 2020

(87) PCT Pub. No.: WO2021/036034
PCT Pub. Date: Mar. 4, 2021

(65) Prior Publication Data
US 2021/0367601 A1    Nov. 25, 2021

(30) Foreign Application Priority Data
Aug. 23, 2019 (CN) .......................... 201910786276.X

(51) Int. Cl.
*G06F 9/38* (2018.01)
*H03K 19/094* (2006.01)
(Continued)

(52) U.S. Cl.
CPC ....... *H03K 19/09425* (2013.01); *G11C 7/106* (2013.01); *G11C 7/1087* (2013.01);
(Continued)

(58) Field of Classification Search
CPC ....... G11C 7/106; G11C 7/1087; G11C 7/222; H03K 3/0233; H03K 19/09425; H03K 19/20
See application file for complete search history.

(56) References Cited

U.S. PATENT DOCUMENTS 6,320,418 B1 * 11/2001 Fujii ........................ G06F 1/32
326/112
6,590,424 B2 * 7/2003 Singh .................... G06F 9/3869
326/93
(Continued)

FOREIGN PATENT DOCUMENTS

CN  106569040 A  4/2017
CN  106569042 A  4/2017
(Continued)

OTHER PUBLICATIONS

PCT/CN2019/120279 International Search Report dated May 27, 2020.

*Primary Examiner* — Kurtis R Bahr
(74) *Attorney, Agent, or Firm* — Alston & Bird LLP

(57) ABSTRACT

The disclosed multi-level driving data transmission circuit and operating method include: a first driving module including a first signal generating unit and a first three-state driver, and a second driving module, including a second three-state driver. The first input terminal of the second three-state driver is coupled to the output terminal of the first three-state driver. The first signal generating unit includes a first and second input terminals, and an output terminal. The output terminal of the first signal generating unit couples to the second input terminal of the first three-state driver. The first signal generating unit receives the first signal through its first input terminal and the first feedback signal of the first signal from the second driving module through its second input terminal. The resultant first control signal has an
(Continued)

effective signal width wider than the first signal. The first control signal inputs to the first three-state driver.

11 Claims, 4 Drawing Sheets

(51) Int. Cl.
*G11C 7/10* (2006.01)
*G11C 7/22* (2006.01)
*H03K 3/0233* (2006.01)
*H03K 19/20* (2006.01)

(52) U.S. Cl.
CPC ........... *G11C 7/222* (2013.01); *H03K 3/0233* (2013.01); *H03K 19/20* (2013.01)

(56) References Cited

U.S. PATENT DOCUMENTS

| | | | |
|---|---|---|---|
| 9,548,735 B1 * | 1/2017 | Ma | G06F 1/3287 |
| 2003/0128046 A1 | 7/2003 | Robertson et al. | |
| 2013/0128655 A1 | 5/2013 | Cheng et al. | |

FOREIGN PATENT DOCUMENTS

| | | |
|---|---|---|
| CN | 210405270 U | 4/2020 |
| JP | S59229923 A | 12/1984 |
| WO | WO 2021/036034 A1 | 3/2021 |

\* cited by examiner

MULTI-LEVEL DRIVE DATA TRANSMISSION CIRCUIT AND METHOD

CROSS REFERENCES TO RELATED APPLICATIONS

This application is a national phase entry of International Application No. PCT/CN2019/120279 filed on Nov. 22, 2019, which claims the benefit of priority to CN Patent Application CN201910786276.X filed on Aug. 23, 2019, both entitled "MULTI-LEVEL DRIVE DATA TRANSMISSION CIRCUIT AND METHOD", the contents of which are incorporated herein by reference in its entirety.

TECHNICAL FIELD

The present disclosure relates to a three-state drive bus transmission technology, in particular, to a multi-level drive data transmission circuit and a data transmission method.

BACKGROUND

In semiconductor integrated circuits, it is a common technique to connect a three-state driver to the bus and use the three-state driver to drive the bus transmission.

The three-state output of the three-state driver is controlled by the control signal. When the control signal is valid, the device realizes the normal logic state output, that is, the input data is directly sent to the output terminal; when the control signal is invalid, the output is in a high impedance state, effective to disconnecting from the related circuit.

However, due to different manufacturing processes, voltage and temperature changes, the control signal of the three-state driver may undergo relatively large changes, resulting in too short output drive time, incomplete output signal, or continuous data confusion at different beats.

The above-mentioned information disclosed in the background section is only used to enhance the understanding of the background of the present disclosure, so it may include information that does not constitute the prior art known to those of ordinary skill in the art.

SUMMARY

In view of this, the present disclosure provides a multi-level drive data transmission circuit and data transmission method.

Other characteristics and advantages of the present disclosure will become apparent through the following detailed description, or partially learned through the practice of the present disclosure.

According to an aspect of the present disclosure, a multi-level drive data transmission circuit includes a first driving module having a first signal generating unit and a first three-state driver; and a second driving module having a second three-state driver. A first input terminal of the second three-state driver is coupled to an output terminal of the first three-state driver. the first signal generating unit includes a first input terminal, a second input terminal, and an output terminal. The output terminal of the first signal generating unit couples with the second input terminal of the first three-state driver. The second driving module includes a second input terminal, wherein the first signal generating unit is configured to receive a first signal through the first input terminal, and receive a first feedback signal of the first signal from the second driving module through the second input terminal. A first control signal is generated based on the first signal and the first feedback signal of the first signal. The first control signal has an effective signal width wider than a width of the first signal. and The first control signal is provided to the first three-state driver.

In some examples, the first signal generating unit further includes a first RS latch. The first input terminal of the first signal generating unit is a setting terminal of the first RS latch and the second input terminal of the first signal generating unit is a reset terminal of the first RS latch, and the output terminal of the first signal generating unit is a first output terminal of the first RS latch.

In some examples, the first signal generating unit further includes a first D flip-flop, the first input terminal of the first signal generating unit is a clock input terminal of the first D flip-flop, the second input terminal of the first signal generating unit is a reset terminal of the first D flip-flop, and the output terminal of the first signal generating unit is an output terminal of the first D flip-flop.

In some examples, the second drive module further includes a signal shaping unit which has an input terminal and an output terminal. The signal shaping unit receives the first signal through its input terminal, shapes the first signal, generates the first feedback signal of the first signal, and outputs the first feedback signal of the first signal through its output terminal.

In some examples, the signal shaping unit further includes an even number of first inverters connected in series.

In some examples, the first drive module further includes a pulse signal generating unit, which has an input terminal and an output terminal, the output terminal of the pulse signal generating unit connects to the first input terminal of the first signal generating unit to receive the first signal, and the pulse signal generating unit generates a pulse signal trigged by the rising edge of the first signal, and provides the pulse signal to the first input terminal of the first signal generating unit.

In some examples, the pulse signal generating unit includes an odd-numbered level gate circuit, a NAND gate, and a second inverter; wherein, the odd-numbered level gate receives the first signal through its input terminal; the NAND gate receives the first signal through its first input terminal, and is coupled to an output terminal of the odd-numbered level gate circuit through its second input terminal, to receive an output signal of the odd-numbered gate circuit, and is further coupled, through its output terminal, to an input terminal of the second inverter; and the output terminal of the second inverter is connected to the first input terminal of the first signal generating unit.

In some examples, the multi-level drive data transmission circuit further includes a third drive module, which includes a third three-state driver, wherein a first input terminal of the third three-state driver is coupled to the output terminal of the second three-state driver; the second driving module further includes a second signal generating unit, the second signal generating unit includes a first input terminal, a second input terminal and an output terminal, and the output terminal of the second signal generating unit is coupled to the second input terminal of the second three-state driver. The second signal generating unit receives the first signal through its first input terminal, receives a second feedback signal of the first signal from the third drive module through its second input terminal, generates a second control signal of the first signal based on the first signal and the second feedback signal, and provides the second control signal to the second three-state driver; and wherein said second control signal has an effective signal width wider than the signal width of the first signal.

According to another aspect of the present disclosure, a method of operating a multi-level drive data transmission circuit includes: receiving a first signal from a current level drive and a feedback signal of the first signal from a next-level drive respectively; generating a control signal based on the first signal and the feedback signal, wherein the control signal has an effective signal width wider than the first signal; and providing the control signal to a three-state driver module of the current level drive.

In other examples, generating the control signal having the effective signal width wider than the first signal includes inputting the first signal and the feedback signal to a set terminal and a reset terminal of a RS latch respectively, and applying a signal from a first output terminal of the RS latch as the control signal.

In other examples, generating the control signal having the effective signal width wider than the first signal comprises: inputting the first signal and a feedback signal to a clock input terminal and a reset terminal of a D flip-flop respectively, applying a signal from an output terminal of the D flip-flop as the control signal, and inputting a fixed voltage signal to a data terminal of the D flip-flop.

In some examples, the method includes: before receiving the feedback signal, shaping the first signal in the next-level drive to form the feedback signal and outputting the feedback signal.

In some examples, the method further includes, before receiving the first signal, generating a pulse signal trigged by a rising edge of the first signal, and outputting the pulse signal as the first signal.

According to the multi-level driving data transmission circuit and the multi-level driving data transmission method of the present disclosure, the control signal input to the three-state driver can be processed such that the original control signal is first sent to the next-level driving module, then have it fed back to the drive module at the current level. Because of the existence of the feedback path, a new control signal having an effective signal width wider than the original control signal can be generated according to the feedback control signal and the original control signal, thereby avoiding the problem that data is unable to transmit completely to the next drive module because there is insufficient effective time of the control signal.

It should be understood that the above general description and the following detailed description are only exemplary and cannot limit the present disclosure.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

Figure 1:
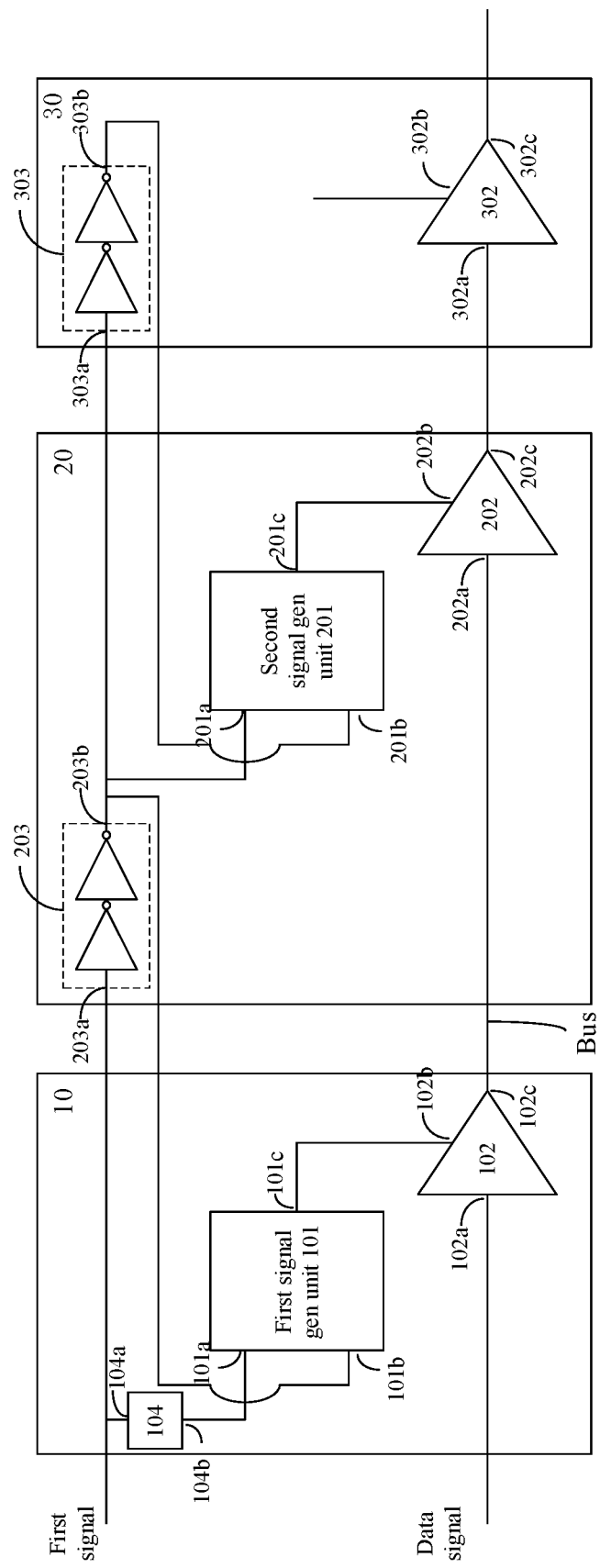
FIG. 1 is a block diagram showing a multi-level drive circuit for data transmission according to an exemplary embodiment.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments To those skilled in the art. The drawings are only schematic illustrations of the present disclosure and are not necessarily drawn to scale. The same reference numerals in the figures denote the same or similar parts, and thus their repeated description will be omitted.

Furthermore, the described features, structures or characteristics can be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known structures, methods, devices, implementations, or operations are not shown or described in detail to avoid overwhelming attention and obscure all aspects of the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features.

As mentioned earlier, the three-state driver is turned on during the valid period of the control signal to output the input data; during the invalid period of the control signal, it is turned off, the output is in a high-impedance state, and the data on the bus is held by the holding circuit. However, if the effective width of the control signal becomes too narrow due to reasons from variations in the manufacturing process, operating voltage, temperature, etc., the turn-on time of the three-state driver may not be sufficient for the data to be completely transmitted to the next-level driver module, and errors occur.

The embodiments of the present disclosure provide a multi-level drive data transmission circuit and a multi-level drive data transmission method, which can process the control signal input to the three-state driver, and send the original control signal to the next-level drive module and then feedback it back to the driver module of this current level. Due to the existence of the feedback path, a new control signal with an effective signal width wider than the original control signal can be generated according to the feedback control signal and the original control signal, thereby avoiding the problem of inability to completely transmit the data to the next level due to insufficient effective time of the control signal.

The following describes first the multi-level drive data transmission circuit provided by the embodiments of the present disclosure.

FIG. 1 is a block diagram showing a multi-level driving data transmission circuit according to an exemplary embodiment.

According to FIG. 1, the multi-level driving data transmission circuit 1 includes: a first driving module 10 and a second driving module 20.

Among them, the first driving module 10 includes: a first signal generating unit 101 and a first three-state driver 102. The second driving module 20 includes: a second three-state driver 202.

The output terminal 102c (data output terminal) of the first three-state driver 102 is coupled to the first input terminal 202a (data input terminal) of the second three-state driver 202 through the Bus, and the data output from the first driver module 10 is transmitted through the Bus to the second driving module 20.

The first signal generating unit 101 includes: a first input terminal 101a, a second input terminal 101b, and an output terminal 101c. The output terminal 101c of the first signal generating unit 101 is coupled to the second input terminal 102b (control signal input terminal) of the first three-state driver 102. The first input terminal 101a of the first signal generating unit 101 is used to receive the first signal (such as the control signal in the data transmission circuit 1), and the second input terminal 101b is used to receive the first feedback signal of the first signal from the second driving module 20. That is, the leading edge of the original control signal (the first signal) is used to turn on the first three-state driver 102 to send the data signal. At the same time, use the same signal line to send the control signal together. After the first signal and the data signal are simultaneously transmitted to the second driving module 20, the first signal is fed back to the second input terminal 101b of the first signal generating unit 101 in the first driving module 10. After receiving the first signal and its feedback signal, the first signal generating unit 101 generates a first control signal whose effective signal width is wider than the first signal according to the first signal and its feedback signal, and is used to provide the first control signal to the first three-state driver 102 to perform data transmission control on the first three-state driver 102.

Figure 2:
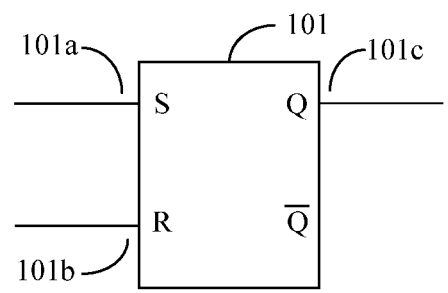
FIG. 2 is a schematic diagram showing the first signal generating unit 101 according to an exemplary embodiment.

FIG. 2 is a schematic diagram showing the first signal generating unit 101 according to an exemplary embodiment. As shown in FIG. 2, in some embodiments, the first signal generating unit 101 may be implemented as an RS latch.

Herein, the first input terminal 101a of the first signal generating unit 101 is the setting terminal of the RS latch (i.e. the S terminal), and the second input terminal 101b is the reset terminal (i.e. the R terminal) of the RS latch, The output terminal 101c is, for example, the first output terminal (i.e. the Q terminal) of the RS latch.

Because of the existence of the feedback path, even if the effective signal width of the first signal (such as the duration of 1) is not enough to enable the data signal to be completely transmitted to the next drive module (such as the second drive module 20), but because the other input terminal of the RS latch also inputs the feedback signal, the RS latch will not be reset as long as the feedback signal is still 0, also that the RS latch can still maintain a valid signal output, keeping the first three-state driver 102 remain in the on state, thereby ensuring complete transmission of the data signal.

Figure 6:
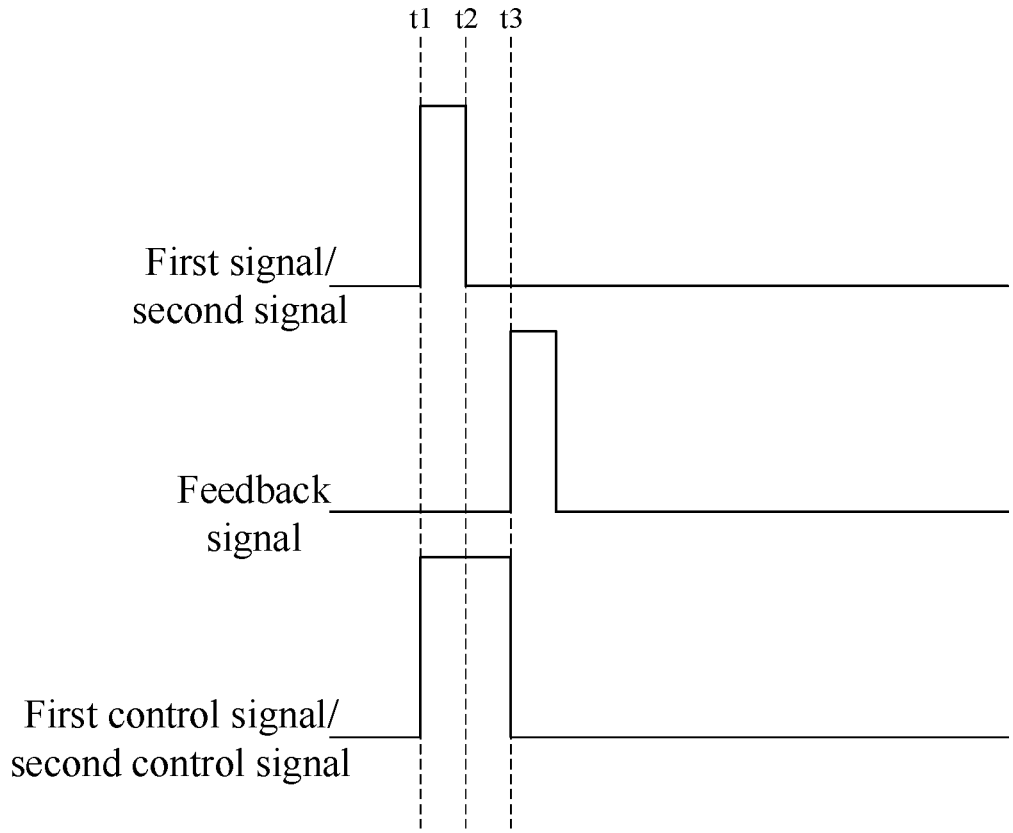
FIG. 6 is a schematic diagram showing signal timing sequence according to an example.

FIG. 6 is a schematic diagram showing signal timing according to an example. As shown in FIG. 6, when the effective width of the first signal is relatively narrow (t1~t2 as shown in the figure), since the feedback signal is 0 at time t2~t3, the first control signal at the first output terminal is still 1 during t2~t3, thus extending the effective width of the first signal (as shown in the figure, the effective signal width is t1~t3).

Figure 7:
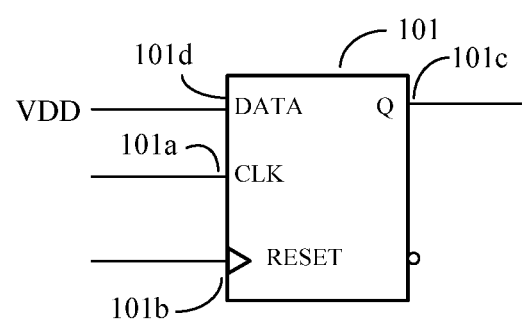
FIG. 7 is a schematic diagram showing another first signal generating unit 101 according to an exemplary embodiment.

FIG. 7 is a schematic diagram showing another first signal generating unit 101 according to an exemplary embodiment. As shown in FIG. 7, in some embodiments, the first signal generating unit 101 may also be implemented as a D flip-flop.

Herein, the first input terminal 101a of the first signal generating unit 101 is the clock signal terminal of the D flip-flop (i.e., the CLK terminal in the figure) for receiving the first signal; the second input terminal 101b is the clock reset signal terminal of the D flip-flop. The reset terminal (that is, the RESET terminal in the figure) is used to receive the feedback signal; the output terminal 101c, as the output terminal of the D flip-flop (that is, the Q terminal in the figure), outputs the first control signal.

In addition, the data terminal 101d (i.e., the DATA terminal in the figure) of the D flip-flop may input a fixed voltage signal VDD.

Similarly, due to the presence of the feedback path, even if the effective signal width of the first signal (such as the duration of 1) is not enough to enable the data signal to be completely transmitted to the next drive module (such as the second drive module 20), the feedback signal into the RESET input terminal of the D flip-flop, so during t2~t3, the feedback signal is 0, the D flip-flop cannot be reset (RESET), as shown in FIG. 6 as an example. That is like performing latching on the current output state of the D flip-flop. Therefore, the first control signal output by the first output terminal during the time t2~t3 is still 1, thereby extending the effective width of the first signal and ensuring the complete transmission of the data signal. Continue referring to FIG. 1, in some embodiments, the second driving module 20 may further include a signal shaping unit 203. The signal shaping unit 203 includes: an input terminal 203a and an output terminal 203b, for receiving a first signal through its input terminal, shaping the first signal, and generating a first feedback signal output through its output terminal 203b. Since the quality of the first signal will become poorer after a long transmission on the bus, the signal shaping unit 203 can shape it to improve its signal quality, thereby ensuring that when the feedback signal is fed back to the first driving module 10, it has better signal quality.

In some embodiments, the signal shaping unit 203 may be implemented as an even number of inverters connected in series to function as a buffer. The first signal is shaped through the buffer after it is transmitted through the bus. Those skilled in the art should understand that the positions of the two inverters connected in series in FIG. 1 are only examples. An even number of inverters connected in series can be connected in series, or connected in series through wires. Different positions in the second driving module 20 are used to shape the received first signal.

It should be noted that when the first driving module 10 is also coupled to other prior driving modules, the first driving module 10 can also include a signal shaping unit to provide the shaped feedback signal of the s first signal to the prior driving module.

For a multi-level transmission path, the control signal input end of the three-state driver at each level of the drive module can be coupled to one of the above-mentioned signal generation units. Referring to FIG. 1, in some embodiments, the data transmission circuit 1 may further include: a third driving module 30. The third driving module 30 includes: a third three-state driver 302. The first input terminal 302a (data input terminal) of the third three-state driver 302 and the output terminal 202c (data output terminal) of the second three-state driver 202 are coupled through a bus.

The second driving module 20 may further include: a second signal generating unit 201. The second signal generating unit 201 includes: a first input terminal 201a, a second input terminal 201b, and an output terminal 201c. The output terminal 201c of the second signal generating unit 201 is coupled to the second input terminal 202b (control signal input terminal) of the second three-state driver 202, and is used to receive the first signal through its first input terminal 201a, and receive the second feedback signal of the first signal from the third driving module 30 through its second input terminal 201b, that is, when the first signal and the data signal are transmitted simultaneously to the third driving module 30, the first signal is fed back to the second input terminal 201b of the second signal generating unit 201 in the second driving module 20. After receiving the first signal and its feedback signal respectively, the second signal generating unit 201 generates a second control signal with an effective signal width wider than the first signal based on the first signal and its feedback signal, which is used to provide to the second three-state driver 202 to perform data transmission control on the second three-state driver 202.

Figure 3:
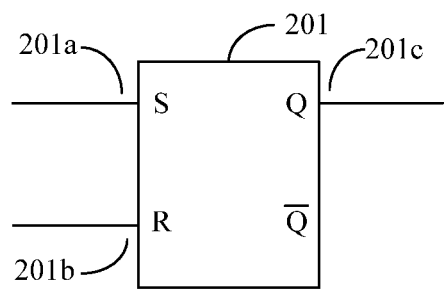
FIG. 3 is a schematic diagram showing a second signal generating unit 201 according to an exemplary embodiment.

FIG. 3 is a schematic diagram showing a second signal generating unit 201 according to an exemplary embodiment. As shown in FIG. 3, in some embodiments, the second signal generating unit 201 can also be implemented as an RS latch.

Herein, the first input terminal 201a of the second signal generating unit 201 is the setting terminal (i.e. S terminal) of the RS latch, and the second input terminal 201b is the reset terminal (i.e. R terminal) of the RS latch, The output terminal 201c is, for example, the first output terminal (i.e., the Q terminal) of the RS latch.

Because of the existence of the feedback path, even if the effective signal width of the first signal (such as the duration of 1) is not enough to enable the data signal to be completely transmitted to the next drive module (such as the second drive module 20), but because the other input terminal of the RS latch also inputs the feedback signal, the RS latch will not be reset as long as the feedback signal is still 0, so that the RS latch will not be reset, and the RS latch can still maintain a valid signal output, keeping the second three-state driver 202 remain in the on state, thereby ensuring complete transmission of data signals.

Similarly, as shown in FIG. 6, when the effective width of the second signal is relatively narrow (t1~t2 as shown in the figure), since the feedback signal is still 0 during t2~t3, the new second control signal from the first output terminal during t2~t3 remains still 1, thus extending the effective width of the second signal (as shown in the figure, the effective signal width is t1~t3).

In addition, the second signal generating unit 201 can also be implemented as the D flip-flop shown in FIG. 7, and its connection circuit and working principle are not repeated here.

Similarly, the third driving module 30 may further include: a signal shaping unit 303. The signal shaping unit 303 includes: an input terminal 303a and an output terminal 303b, for receiving a first signal through its input terminal, shaping the first signal, and generating a second feedback signal output through its output terminal 303b. Since the quality of the first signal may become poor after a long transmission on the bus, the signal shaping unit 303 can shape it to improve its signal quality, thereby ensuring that the second feedback signal is fed back to the second driving module 20 with good signal quality.

In some embodiments, the signal shaping unit 303 can also be implemented as two coupled inverters to function as a buffer. After the first signal is transmitted through the bus, it is shaped through the buffer.

In addition, the third driving module 30 shown in FIG. 1 may also include the above-mentioned signal generating unit, the output of which is coupled to the second input terminal 302b (control signal input terminal) of the third three-state driver 302. To simplify the drawing, the signal generating unit is not shown in the figure.

It should be noted that the data transmission circuit 1 in FIG. 1 has the multiple drive modules connected in serial as an example, but the present disclosure is not limited to this. For example, two parallel connected branches of the drive modules may also be serially connected through a bus to the next level of drive modules, etc.

In some embodiments, in order to prevent the RS latch from working abnormally due to a too large width of the input first signals, a pulse signal can be generated at the rising edge of the first signal input terminal (101a or 201a) of the first signal generation unit (101 or 201).

Figure 4:
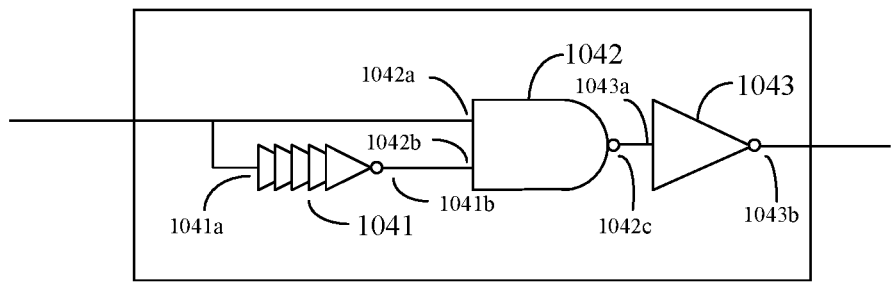
FIG. 4 is a block diagram showing a pulse signal generating unit according to an exemplary embodiment.

FIG. 4 is a block diagram showing a pulse signal generating unit according to an exemplary embodiment. Referring jointly to FIG. 1 and FIG. 4, the first driving module 10 may further include: a pulse signal generating unit 104. The pulse signal generating unit 104 includes: an input terminal 104a and an output terminal 104b. The output terminal 104b is coupled to the first input terminal 101a of the first signal generating unit 101. The pulse signal generating unit receives a first signal and generates a pulse signal tripped by the rising edge of the first signal, and, and provides the pulse signal to the first signal generation unit 101 through the first input terminal 101a of the first signal generation unit 101.

As shown in FIG. 4, the pulse signal generating unit 104 may include, for example, an odd-numbered stage gate circuit 1041, a NAND gate 1042, and an inverter 1043. Among them, the odd-stage gate circuit 1041 receives the first signal through its input terminal 1041a; the NAND gate 1042 receives the first signal through its first input terminal 1042a, coupled through its second input terminal 1042b to the output terminal 1041b of odd-stage gate circuit 1041, to receive the output signal of the odd-numbered gate circuit 1041, and is coupled to the input terminal 1043a of the inverter 1043 through its output terminal 1042c; the output terminal 1043b of the inverter 1043 is coupled to the first input terminal 101a of the first signal generating unit 101.

Herein, the delay time of the odd-numbered gate circuit 1041 is the width of the pulse signal. The pulse signal generation unit 104 generates a pulse signal as input, which can prevent the RS latch from malfunctioning from the width of the input first signal being too large.

Similarly, the second driving module 20 and the third driving module 30 may also include the above-mentioned pulse signal generating units. To avoid repeating descriptions here and to simplify the drawings, these are not shown in FIG. 1, In addition, the first signal generating unit 101 may also be implemented as a combination of an inverter and a falling edge detection circuit, for example. The falling edge detection circuit can be implemented by replacing the NAND gate 1042 shown in FIG. 4 with a NOR gate, and removing the inverter 1043, for example. At the same time, in order to detect the rising edge of the first signal and generate a pulse signal based on the rising edge, it is also necessary to add an inverter before the falling edge detection circuit, so that the rising edge of the received first signal converts to a falling edge.

It should be clearly understood that the present disclosure describes how to form and use specific examples, but the principles of the present disclosure are not limited to any details of these examples. On the contrary, based on the teaching of the contents of the present disclosure, these principles can be applied to many other embodiments.

The following are embodiments of the disclosed method, which can be applied to the embodiments of the disclosed devices. For details not disclosed in the method embodiments of the present disclosure, please refer to the device embodiments of the present disclosure.

Figure 5:
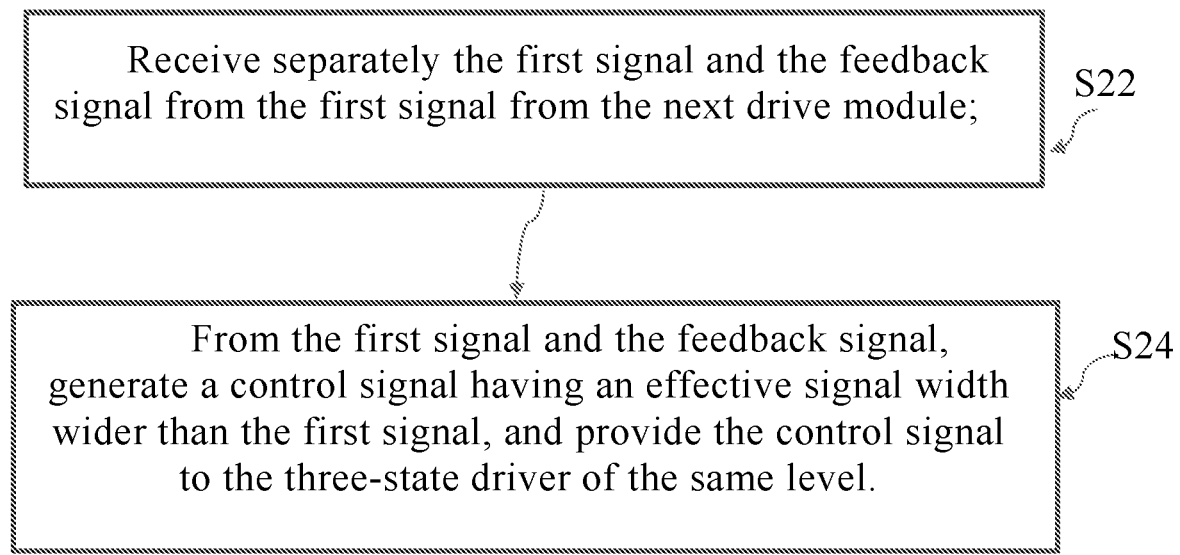
FIG. 5 is a flow chart showing a method for transmitting multi-level drive data according to an exemplary embodiment.

FIG. 5 is a flow chart showing a method for transmitting multi-level driving data according to an exemplary embodiment. The multi-level driving data transmission method, shown in FIG. 5, can be applied to the above-mentioned multi-level driving data transmission circuit.

Referring to FIG. 5, the multi-level drive data transmission method 2 includes:

In step S22, the first signal and the feedback signal of the first signal from the next-level driving module are respectively received.

For example, the first signal generating unit 101 or the second signal generating unit 201 receives the first signal and the feedback signal of the first signal from the second driving module 20 or the third driving module 30, as in FIG. 1.

In step S24, a control signal is generated with an effective signal width wider than the first signal based on the first signal and the feedback signal, and the control signal is then provided to the three-state driver in the driver module of the current level.

For example, through the first signal generating unit 101 or the second signal generating unit 201 as shown in FIG. 1, based on the first signal and the feedback signal, a control signal with an effective signal width wider than the first signal is generated, and the control signal is provided to the state driver 102 or the second three-state driver 202.

because of the existence of the feedback path, a new control signal with an effective signal width wider than the original control signal can be generated based on the feedback control signal and the original control signal, thereby avoiding the inability to completely transmit the data to the next level due to insufficient effective time of the control signal.

In some embodiments, step S24 can be further implemented by the following embodiments: respectively input the first signal and the feedback signal to the set terminal and the reset terminal of the RS latch, and use the signal of the first output terminal of the RS latch as the control signal.

In some embodiments, step 24 can be implemented by the following embodiments: the first signal and the feedback signal are respectively input to the clock input terminal and the reset terminal of the D flip-flop, and take the signal output from the output terminal of the D flip-flop as the control signal, take a fixed voltage signal VDD to the data terminal of the D flip-flop.

In some embodiments, before step S22, the multi-level driving data transmission method 1 may further include: in the next-level driving module, shaping the received first signal to acquire and output the feedback signal. For example, the received first signal may be shaped by the signal shaping unit 203 or the signal shaping unit 303 as shown in FIG. 1, so as to provide first feedback signal to the first signal generating unit 101 or the second feedback signal to second signal generating unit 102.

In some embodiments, before step S22, the multi-level driving data transmission method 1 may further include: generating a pulse signal according to the rising edge of the first signal, and outputting the pulse signal as the first signal.

In addition, it should be noted that the above-mentioned drawings are only schematic illustrations of the processing steps included in the method according to the exemplary embodiment of the present disclosure, and are not intended for limitation. It is easy to understand that the processing shown in the above drawings does not indicate or limit the time sequence of the processing. In addition, it is easy to understand that these processes can be executed synchronously or asynchronously in multiple modules, for example.

The exemplary embodiments of the present disclosure are specifically shown and described above. It should be understood that the present disclosure is not limited to the detailed structure, arrangement or implementation method described herein; on the contrary, the present disclosure intends to cover various modifications and equivalent arrangements included in the spirit and scope of the appended claims.

The invention claimed is:

1. A multi-level drive data transmission circuit, comprising:
   a first driving module comprising a first signal generating unit and a first three-state driver; and
   a second driving module comprising a second three-state driver;
   wherein a first input terminal of the second three-state driver is coupled to an output terminal of the first three-state driver;
   wherein the first signal generating unit comprises: a first input terminal, a second input terminal, and an output terminal;
   wherein the output terminal of the first signal generating unit couples with the second input terminal of the first three-state driver;
   wherein the second driving module comprises a second input terminal,
   wherein the first signal generating unit is configured to receive a first signal through the first input terminal and a first feedback signal of the first signal from the second driving module through the second input terminal;
   wherein a first control signal is generated based on the first signal and the first feedback signal of the first signal;
   wherein the first control signal has an effective signal width wider than a width of the first signal;
   wherein the first control signal is provided to the first three-state driver;
   wherein the first drive module further comprises: a pulse signal generating unit, comprising: an input terminal and an output terminal, wherein the output terminal of the pulse signal generating unit connects to the first input terminal of the first signal generating unit to receive the first signal, and wherein the pulse signal generating unit generates a pulse signal trigged by the rising edge of the first signal, and provides the pulse signal to the first input terminal of the first signal generating unit;
   wherein the pulse signal generating unit comprises: an odd-numbered level gate circuit, a NAND gate, and a second inverter;
   wherein, the odd-numbered level gate receives the first signal through its input terminal; and
   wherein the NAND gate receives the first signal through its first input terminal, and is coupled to an output terminal of the odd-numbered level gate circuit through its second input terminal, to receive an output signal of the odd-numbered gate circuit, and is further coupled, through its output terminal, to an input terminal of the second inverter; and wherein the output terminal of the second inverter is connected to the first input terminal of the first signal generating unit.

2. The multi-level drive data transmission circuit according to claim 1, wherein the first signal generating unit further comprises: a first RS latch, wherein the first input terminal of the first signal generating unit is a setting terminal of the first RS latch, wherein the second input terminal of the first signal generating unit is a reset terminal of the first RS latch, and wherein the output terminal of the first signal generating unit is a first output terminal of the first RS latch.

3. The multi-level drive data transmission circuit according to claim 1, wherein the first signal generating unit further comprises: a first D flip-flop, wherein the first input terminal of the first signal generating unit is a clock input terminal of the first D flip-flop, wherein the second input terminal of the first signal generating unit is a reset terminal of the first D flip-flop, and wherein the output terminal of the first signal generating unit is an output terminal of the first D flip-flop.

4. The multi-level drive data transmission circuit according to claim 1, wherein the second drive module further comprises: a signal shaping unit comprising: an input terminal and an output terminal; wherein the signal shaping unit receives the first signal through its input terminal, shaping the first signal, generating the first feedback signal of the first signal, and outputting the first feedback signal of the first signal through its output terminal.

5. The multi-level drive data transmission circuit according to claim 4, wherein the signal shaping unit further comprises: an even number of first inverters connected in series.

6. The multi-level drive data transmission circuit according to claim 1, further comprising:
a third drive module, comprising a third three-state driver, wherein a first input terminal of the third three-state driver is coupled to the output terminal of the second three-state driver;
wherein the second driving module further comprises a second signal generating unit, wherein the second signal generating unit comprises a first input terminal, a second input terminal and an output terminal; wherein the output terminal of the second signal generating unit is coupled to the second input terminal of the second three-state driver;
wherein the second signal generating unit receives the first signal through its first input terminal, receives a second feedback signal of the first signal from the third drive module through its second input terminal, generates a second control signal of the first signal based on the first signal and the second feedback signal, and provides the second control signal to the second three-state driver; and
wherein said second control signal has an effective signal width wider than the signal width of the first signal.

7. A method of operating a multi-level drive data transmission circuit according to claim 1, comprising:
receiving a current level signal from a current level drive and a current level feedback signal of the current level signal from a next-level drive respectively;
generating a current level control signal based on the current level signal and the current level feedback signal, wherein the current level control signal has an effective signal width wider than the current level signal; and
providing the current level control signal to a current level three-state driver module of the current level drive.

8. The method of operating the multi-level drive data transmission circuit according to claim 7, wherein generating the current level control signal having the effective signal width wider than the current level signal comprises: inputting the current level signal and the current level feedback signal to a set terminal and a reset terminal of a current level RS latch respectively, and applying a signal from a first output terminal of the current level RS latch as the current level control signal.

9. The method of operating the multi-level drive data transmission circuit according to claim 7, wherein generating the current level control signal having the effective signal width wider than the current level signal comprises: inputting the current level signal and the current level feedback signal to a current level clock input terminal and a reset terminal of a current level D flip-flop respectively, applying a signal from an output terminal of the current level D flip-flop as the current level control signal, and inputting a fixed voltage signal to a data terminal of the current level D flip-flop.

10. The method of operating the multi-level drive data transmission circuit according to claim 7, further comprising: before receiving the current level feedback signal, shaping the current level signal in the next-level drive to form the current level feedback signal and outputting the current level feedback signal.

11. The method of operating the multi-level drive data transmission circuit of claim 7, further comprising: before receiving the current level signal, generating a pulse signal trigged by a rising edge of the current level signal, and outputting the pulse signal as the current level signal.

* * * * *